(12) United States Patent
Baumgarte et al.

(10) Patent No.: US 11,563,411 B2
(45) Date of Patent: Jan. 24, 2023

(54) METADATA FOR LOUDNESS AND DYNAMIC RANGE CONTROL

(71) Applicant: Apple Inc., Cupertino, CA (US)

(72) Inventors: Frank Baumgarte, Sunnyvale, CA (US); Eric A. Allamanche, Sunnyvale, CA (US); Stefan K. O. Strommer, Froson (SE)

(73) Assignee: APPLE INC., Cupertino, CA (US)

( * ) Notice: Subject to any disclaimer, the term of this patent is extended or adjusted under 35 U.S.C. 154(b) by 8 days.

(21) Appl. No.: 17/191,481

(22) Filed: Mar. 3, 2021

(65) Prior Publication Data

US 2021/0351754 A1 Nov. 11, 2021

Related U.S. Application Data

(63) Continuation of application No. 16/776,297, filed on Jan. 29, 2020, now Pat. No. 10,958,229, which is a continuation of application No. 15/417,424, filed on Jan. 27, 2017, now Pat. No. 10,644,666, which is a continuation of application No. 14/225,950, filed on Mar. 26, 2014, now Pat. No. 9,559,651.

(60) Provisional application No. 61/806,570, filed on Mar. 29, 2013.

(51) Int. Cl.
*H03G 3/20* (2006.01)
*G10L 21/0316* (2013.01)
*G10L 19/008* (2013.01)
*H03G 7/00* (2006.01)

(52) U.S. Cl.
CPC ............. *H03G 3/20* (2013.01); *G10L 19/008* (2013.01); *G10L 21/0316* (2013.01); *H03G 7/007* (2013.01)

(58) Field of Classification Search
None
See application file for complete search history.

(56) References Cited

U.S. PATENT DOCUMENTS

2016/0197590 A1\* 7/2016 Koppens ............. H03G 9/18
381/106

OTHER PUBLICATIONS

Article 94(3) EPC for European Application No. 19170552.4 mailed Apr. 29, 2021, 5 pages.
"A Guide to Dolby Metadata," retrieved from the Internet <http://www.dolby.com/uploadedFiles/Asset/US/Doc/Professional/18_Metadata.Guide.pdf>, Jan. 1, 2005, 28 pages.

\* cited by examiner

*Primary Examiner* — Kenny H Truong
(74) *Attorney, Agent, or Firm* — Womble Bond Dickinson (US) LLP

(57) ABSTRACT

An audio normalization gain value is applied to an audio signal to produce a normalized signal. The normalized signal is processed to compute dynamic range control (DRC) gain values in accordance with a selected one of several predefined DRC characteristics. The audio signal is encoded, and the DRC gain values are provided as metadata associated with the encoded audio signal. Several other embodiments are also described and claimed.

19 Claims, 7 Drawing Sheets

METADATA FOR LOUDNESS AND DYNAMIC RANGE CONTROL

This non-provisional application is a continuation of co-pending U.S. application Ser. No. 16/776,297 filed on Jan. 29, 2020, which is a continuation of U.S. application Ser. No. 15/417,424 filed on Jan. 27, 2017, which is a continuation of U.S. application Ser. No. 14/225,950 filed on Mar. 26, 2014, which claims the benefit of the earlier filing date of U.S. Provisional Application No. 61/806,570, filed Mar. 29, 2013, which application is incorporated hereby by reference.

An embodiment of the invention pertains generally to the encoding and decoding of an audio signal and the use of metadata associated with the encoded signal to improve quality of playback of the decoded signal in a consumer electronics end user device. Other embodiments are also described.

BACKGROUND

Digital audio content appears in many different instances, including for example music and movie files. In most instances, an audio signal is encoded for purposes of data-rate reduction, so that the transfer or delivery of the media file or stream consumes less bandwidth and is faster, thereby allowing numerous other transfers to occur simultaneously. The media file or stream can be received in different types of end user devices where the encoded audio signal is decoded before being presented to the consumer through either built-in or detachable speakers. This has helped fuel consumers' appetite for obtaining digital media over the Internet. Creators and distributors of digital audio programs have several industry standards at their disposal, which can be used for encoding and decoding audio content. These include Digital Audio Compression Standard (AC-3, E-AC-3), Revision B, Document A/52B, 14 Jun. 2005 published by the Advanced Television Systems Committee, Inc. (the "ATSC Standard"), European Telecommunication Standards Institute, ETSI TS 101 154 Digital Video Broadcasting (DVB) based on MPEG-2 Transport Stream in ISO/IEC 13818-7, Advanced Audio Coding (AAC) ("MPEG-2 AAC Standard"), and ISO/IEC 14496-3 ("MPEG-4 Audio"), published by the International Standards Organization (ISO).

There is an ever increasing variety of end user devices for the playback of digital audio, including desktop computers, laptop computers, portable handheld devices (e.g., smartphones), home televisions, and in-vehicle media systems. These devices have different analog signal paths, speakers and acoustic environments. Also, the dynamic range of an audio signal varies between different programs. In addition, producers (including creators and sometimes even distributors) of digital audio programs often wish to increase the average loudness of their programs, by digitally modifying an audio signal so that its average loudness is higher by several dB. Doing so however also requires that the peak levels of the resulting audio signal be reduced in order to avoid clipping (which leads to undesirable audible distortion). This is achieved using dynamic range control (DRC), which compresses the highs and lows of the audio signal so that the resulting audio signal can fit within a narrower envelope (thereby avoiding clipping). All of these factors however create an issue in that loudness as perceived by the end user can vary significantly, both across different end user devices and between consecutive programs on the same device, leading to an unpleasant user experience during playback.

A software tool such as the SoundCheck™ program by Apple Inc. automatically adjusts the playback volume of songs to hopefully yield the same perceivable loudness, so that for example a recent pop recording that has a smaller dynamic range but higher average loudness is turned down, as compared to an older song from the 1970's. Also, an audio program can include a metadata portion that is associated with the encoded audio signal and which describes the associated audio signal. The metadata can include information that is used by software in the end user device to control for example the dialogue level, DRC, and any downmixing of the decoded audio signal, so as to change the consumer's experience during playback.

SUMMARY

A systematic yet still flexible approach to controlling the quality of audio delivered to a consumer, using any conventional encoding/decoding (codec) and associated metadata construct, is desirable. At least the following embodiments of the invention are described in greater detail below.

In one embodiment, a method for encoding an audio signal encompasses applying an audio normalization gain value to an audio signal, in order to produce a normalized signal. The normalized signal is processed so as to compute a number of dynamic range control (DRC) gain values for the normalized signal. The DRC gain values are computed in accordance with a selected one of several predefined DRC characteristics. The audio signal is encoded and the gain values are provided as metadata associated with the encoded signal. The provided DRC gain values may then be applied in the decoding stage of playback processing to the decoded audio signal, to adjust the dynamic range of the decoded audio signal during playback.

In another embodiment, several pre-defined DRC characteristics are "known" to the encoder and decoder apparatuses. The index of the DRC characteristic that is used in the encoder apparatus is communicated to the decoder apparatus. This enables the decoder apparatus of an end user device to modify the provided DRC gain values (that it uses to compress the decoded audio signal), in accordance with local parameters such as user input (including playback volume and/or loudness normalization on or off settings), the user context (or condition in which an end user device is being used, e.g. late night, in-vehicle, etc.), and the dynamic range of the digital-to-analog converter and the speaker that is to be used for playback of the decoded audio signal.

In another embodiment, loudness information or loudness parameters can be computed in the encoding apparatus, e.g. about a DRC compressed version, or a downmixed version, of a multi-channel audio signal. The loudness information can then be provided as metadata associated with the encoded multi-channel audio signal. In one embodiment, at the encoding apparatus, a loudness parameter of a downmixed version of an input multi-channel audio signal is measured, and where the downmix signal may have been obtained with or without DRC having been previously applied to the input signal.

There are various loudness parameters that may be provided by the encoding stage, together with for example the downmix gains that were used to produce a downmixed signal in the encoding stage, as metadata associated with an encoded version of the input signal. The loudness information that is contained in the metadata may include one or more of the following: program loudness (as in a subjective loudness measure of an entire audio program such as computed in accordance with ITU BS.1770), a true peak value (such as measured in accordance with ITU BS.1770), anchor loudness, loudness range, top of loudness range, maximum momentary loudness, and short-term loudness. This metadata may also include an index of the DRC characteristic that has been selected to generate DRC gain values for the input audio signal, which DRC gain values may also be included in the metadata.

In the decoding apparatus, a DRC processor can adjust or generate different gain values for DRC, based on 1) the index of DRC characteristic obtained in the metadata, 2) the DRC gain values obtained in the metadata, and 3) local parameters including, for example, user input such as volume setting and loudness normalization on/off setting. Thus, dynamic range control can be achieved in real-time during playback processing, without the decoding apparatus having to compute per-frame loudness values (or DRC input levels) of the decoded audio signal. In one embodiment, the metadata associated with an audio file or stream is read by a media player running in the decoder apparatus, when decoding the audio file or stream, and is used to automatically (i.e., without user input and transparently to the user) adjust loudness of the decoded digital audio content (prior to digital to analog conversion). This may be done to improve the user's experience of playback of the content in the audio file, or stream, depending upon user input and the dynamic range of the user-selected playback mode (e.g., line-out vs. a built-in speaker).

In a further embodiment, the amount of DRC compression applied in the decoding apparatus is controlled in accordance with a playback volume set by the user and/or a true peak value measured by the encoding apparatus and provided via metadata, and/or based on target headroom (difference between peak level of a digital audio signal and its clipping level) that can be computed in the decoding apparatus based on the user playback volume setting and the dynamic range available from the digital to analog conversion and speaker devices being used for playback.

In yet another embodiment, a target DRC characteristic may be defined in the decoding stage, and this target may be achieved by i) finding out which encoding stage DRC characteristic was used, and ii) comparing the two DRC characteristics to determine how to modify the received DRC gain values. Dynamic range adjustment is thus modified in real-time at the decoder, based on the DRC characteristic index extracted from the metadata (pointing to the DRC characteristic that was used by the encoder), the extracted DRC gain values set at the encoding stage, and based on certain local conditions that suggest that a different target DRC characteristic index be adopted.

In another embodiment, loudness information concerning a DRC-compressed audio content signal, and/or a downmixed audio content signal, is generated and embedded as metadata in an encoded, multi-channel digital audio file or stream. This particular metadata is then used after decoding (in the decoding stage), to improve the user's experience by customizing a downmix of the decoded multi-channel audio content.

In yet another embodiment, the amount of DRC-compression applied in the decoding stage (to the decoded audio content signal, prior to driving the speaker) is varied in order to avoid clipping at the input of the speaker. This varying of the DRC-compression may be a function of a) the playback volume set by the user, b) the true peak value (that is extracted from the encoded audio file or stream), and/or c) the target headroom (after DRC-compression has been applied) at the input to the digital to analog converter (DAC). For example, at low playback volumes, there is more headroom, so that less DRC-compression can be applied which in turn will allow taller peaks in the decoded audio signal to be passed through to the speaker.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. Also, a given figure may be used to illustrate the features of more than one embodiment of the invention, and not all elements in the figure may be required for a given embodiment.

DETAILED DESCRIPTION

Several embodiments of the invention are described here as metadata enhancements in digital audio coding and decoding, used for loudness normalization and dynamic range control (DRC) during playback of a coded audio file or a coded audio stream that has the specified metadata. While numerous details are set forth, it is understood that some embodiments of the invention may be practiced without these details. In other instances, well-known circuits, structures, and techniques have not been shown in detail so as not to obscure the understanding of this description. For example, certain details are described here in the context of encoding for bit-rate reduction in accordance with MPEG standards, the embodiments of the invention are also applicable to other forms of audio coding and decoding including lossless data compression, such as Apple Lossless Audio Codec (ALAC).

Figure 1:
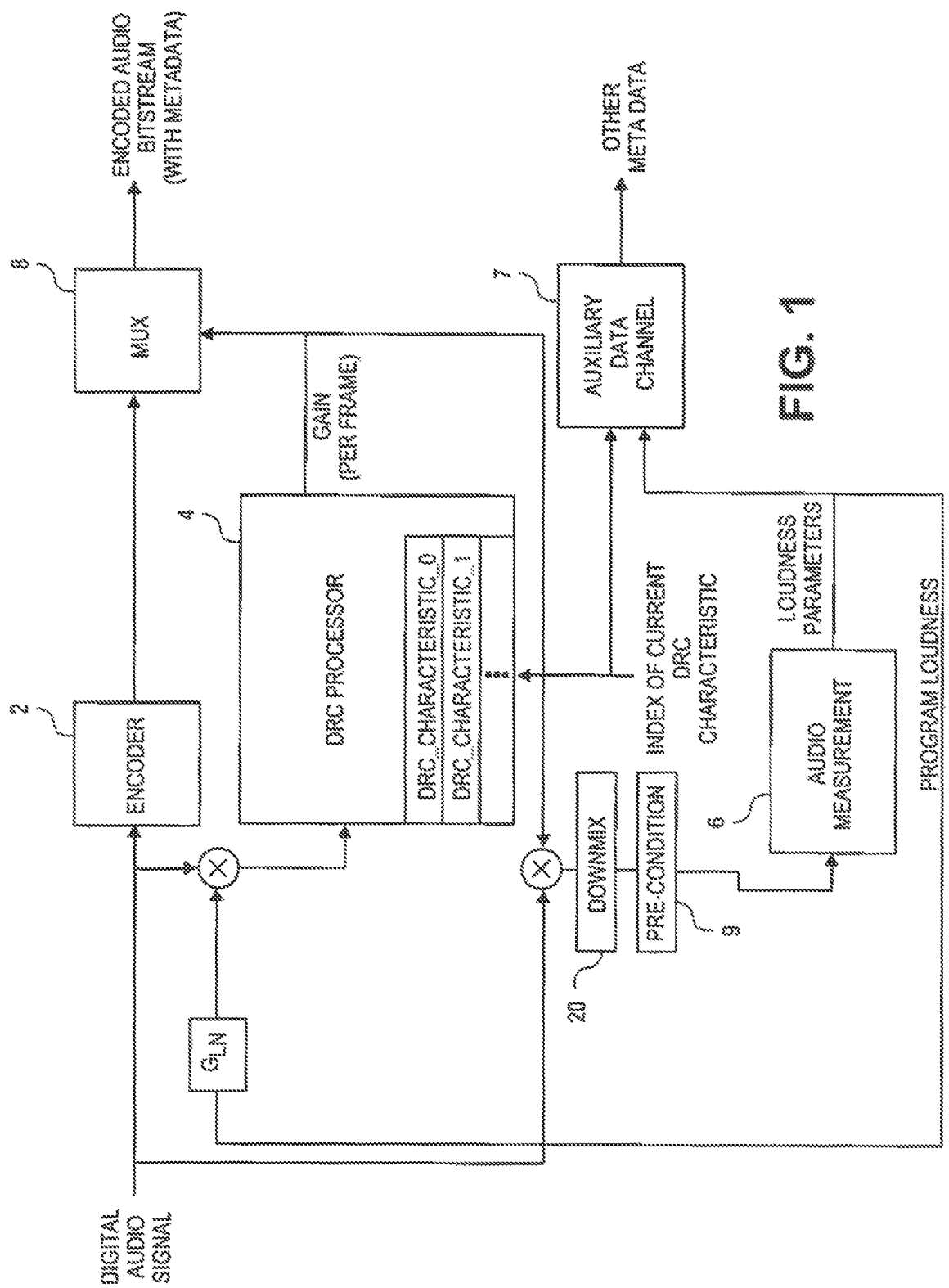
FIG. 1 is a block diagram of relevant components of a digital audio encoding stage or encoding apparatus.

Referring to FIG. 1, a block diagram of an encoder stage or encoder apparatus, in accordance with an embodiment of the invention is shown. This block diagram can be used to describe not only a digital audio encoder apparatus, but also a method for encoding an audio signal. A digital audio signal is encoded by an encoder 2, and then may be assembled with metadata using a multiplexer (mux) 8. The resulting encoded audio or encoded audio bitstream contains embedded metadata that includes a dynamic range control (DRC) gain value per frame of digital audio. Although not shown, an alternative to embedding the metadata with the encoded signal is to provide the metadata (including in this case per-frame DRC gain values) through a separate metadata channel referred to in FIG. 1 as an auxiliary data channel 7. The encoding of the audio signal may involve lossy data rate reduction encoding or it may involve lossless data compression. Also, the audio signal may be a pulse code modulated, PCM, digital audio sequence or other sampled single channel or multi-channel audio signal (also referred to here as an audio program) that can include multiple channels of audio, e.g. six channel 5.1 surround, 2-channel stereo, etc.

Figure 2:
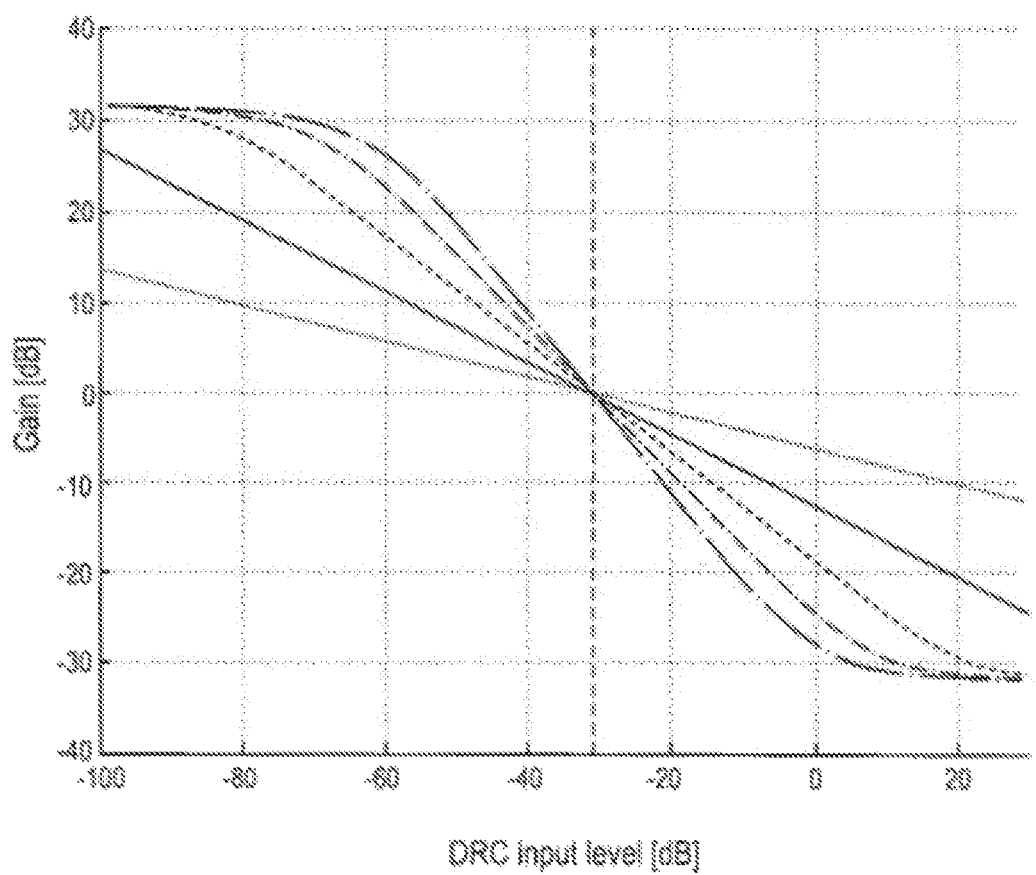
FIG. 2 shows several example DRC characteristics that can be used in the encoding stage.

The metadata includes a DRC gain value (per frame) that is computed by a DRC processor 4. A normalizer or adjuster, represented by a multiplier symbol as shown, applies an audio normalization gain value (e.g., $G_{LN}$) to an input digital audio signal, to produce a normalized signal. The normalized signal is processed (by the DRC processor 4) to compute a number of DRC gain values in accordance with a selected one of a number of per-defined DRC characteristics. The DRC characteristics may be stored within memory as part of the DRC processor 4, within the encoding apparatus. Examples of the DRC characteristics are given in FIG. 2 where DRC input level along the x-axis refers to a short term loudness value (also referred to here as DRC input level), and a range of gain values along the y-axis that are to be applied to achieve a compressive or expansive effect upon the input audio signal. The gain values in FIG. 2 are also referred to here as DRC gain values.

Audio normalization is the application of a constant amount of gain to an audio recording (also referred to as an audio program, or an audio signal) to bring an average or peak value of the audio signal to a target level (the norm). When the same amount of gain is applied across the full signal or audio program, the signal-to-noise ratio and relative dynamics of the signal are for the most part unchanged. Normalization differs from dynamic range compression or dynamic range control (DRC), which applies time-varying levels of gain to the input audio signal, to fit the result within a minimum to maximum range. Examples include peak normalization wherein the gain is changed to bring the highest digital sample value (e.g., pulse code modulated, PCM, value) or analog signal peak to a given level.

Another type of audio normalization is based on a measure of program loudness. Here, the applied gain (which is depicted in FIG. 1 specifically as program loudness normalization gain or $G_{LN}$) is changed to bring for example the average loudness over the entire audio program to a target level. Examples of program loudness include a measure of average power such as RMS value, or a measure of human perceived loudness such as that offered by International Telecommunication Union (ITU) Recommendation BS.1770 "Algorithms to measure programme loudness and true-peak audio level". Depending on the dynamic range of the input signal and the target level, program loudness normalization can result in peaks that are higher than a given recording or transmission or playback medium's limits. In such cases, DRC can be used to prevent clipping in such cases, which in turn can alter signal-to-noise ratio and relative dynamics of the audio signal.

DRC can reduce the volume of loud sounds or amplify quiet sounds, by narrowing or "compressing" an audio signal's dynamic range. Compression is commonly used in sound recording and reproduction and broadcasting. An electronic hardware unit, or audio software, used to apply compression is sometimes called a compressor. Compressors often have several controls, including for example a threshold (e.g., in dB), a ratio or amount of gain reduction (gain value), attack and release controls that vary the rate at which compression is applied and smooth the effect, and a hard/soft knee control.

Figure 4:
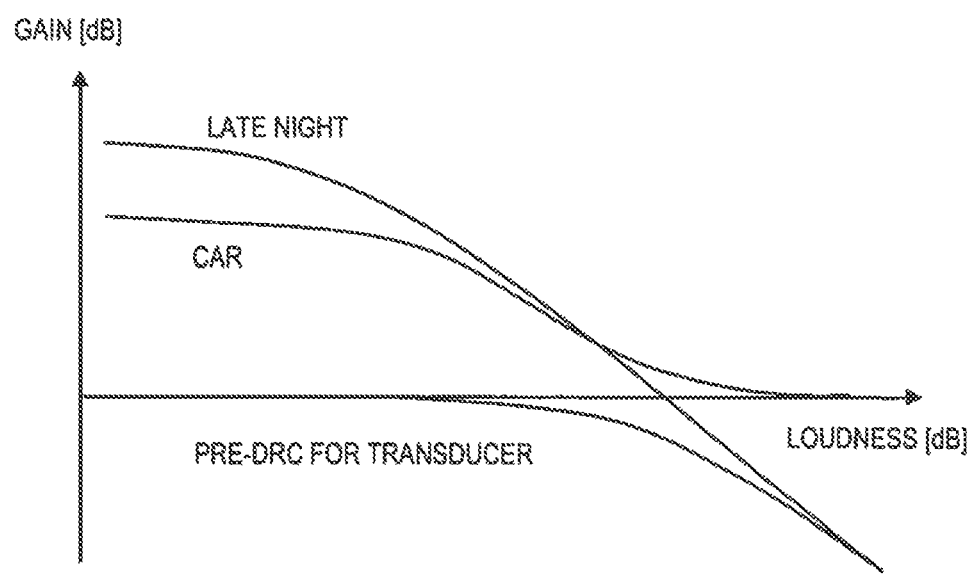
FIG. 4 shows several example DRC characteristics that can be used in the decoding stage to produce new DRC gain values.
Figure 6:
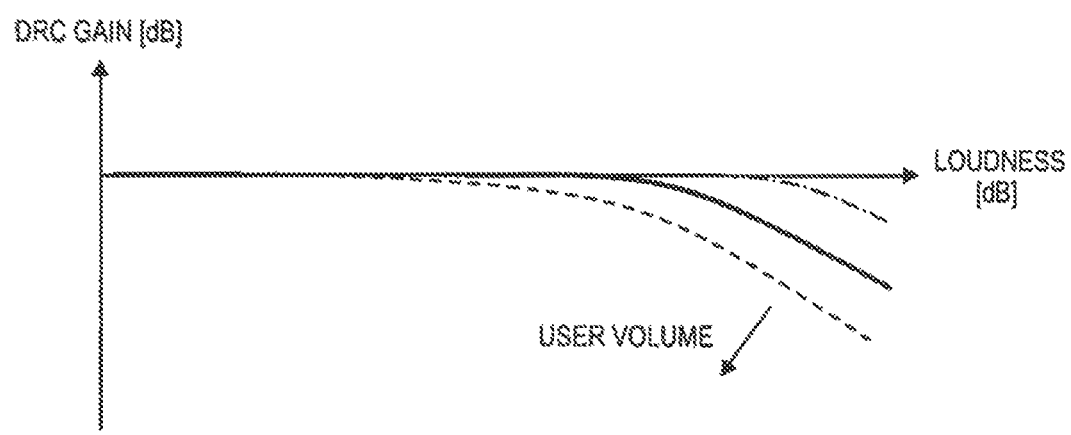
FIG. 6 shows several example DRC characteristics suitable for use in a decoding stage to produce new gain values.

A DRC characteristic (as the phrase is used here) gives the relationship between a short-term measure of loudness of an input audio signal (also referred to here as "loudness [dB]" in FIG. 4 or DRC input level in FIG. 2) computed over a time interval that can be on the order of a frame or packet of the digital audio signal, e.g. an interval of between 5-100 msec, and a gain value that can be applied to the input audio signal. This may also be referred to as a compressor profile (where the gain values serve to either compress or expand the input audio signal). Several example DRC characteristics that can be used in an encoding stage are shown in FIG. 2, while FIG. 4 and FIG. 6 show example DRC characteristics that can be used in a decoding stage (to be described below).

Any suitable process may be used to select the current DRC characteristic in the encoding stage. In response to receiving the selection, the DRC processor 4 accesses the stored DRC characteristic and applies the accessed profile to the input signal (in this case being the gain-normalized digital audio signal), and thereby generates per-frame DRC gain values. The DRC processor 4 may generate the DRC gain values as follows. The normalized audio signal is processed so as to compute a short-term measure of loudness, e.g. computed on the order of about one frame of the input audio signal. The computed short-term measure of loudness is then used as input to a lookup table that reflects one of the DRC characteristics, such as those depicted in FIG. 2 or any other suitable DRC characteristic, to result in a DRC gain value. For example, if the audio frame is soft, a more positive DRC gain is likely to result, and if loud, then a more negative DRC gain value is likely. In one embodiment, each frame of the input digital audio may be associated with an independently generated DRC gain value. The DRC gain values are then provided as metadata associated with the encoded audio signal, for example, embedded within the same bitstream. Such an encoding apparatus may be part of a media server that is responding to a request from, for example, a client program running in an end user device, to transmit the audio program (e.g., as part of a music file, for example, or a movie file) over the Internet to the requesting end user device. Alternatively, the encoded audio bitstream may be provided for storage in any form of suitable recording medium.

In one embodiment, the DRC processor 4 may be viewed as operating in parallel with the encoder 2, except that the input to the DRC processor 4 is a normalized version of the audio signal that is input to the encoder 2. In the example of FIG. 1, the normalization value $G_{LN}$ may be a scalar that is fixed for an entire audio program and that is multiplied with the signal samples of the digital audio signal. The normalization gain value $G_{LN}$ may be computed "in advance" of passing the (normalized) audio signal through the DRC processor 4. The normalization gain may be computed (by the block labeled $G_{LN}$ in FIG. 1) based on a loudness parameter that was previously computed by an audio measurement module 6, for example program loudness. This may be done by the audio measurement module 6 in a first pass through the input audio signal, prior to the DRC processor 4 performing a second pass (through a normalized version of the input audio signal). The computation of $G_{LN}$ then follows, based on, for example, a ratio of (i) a measured loudness of the original digital audio program (e.g., program loudness computed for the entire original audio program) and (ii) a target or desired loudness. See below for additional details on how to compute an example $G_{LN}$.

In a further embodiment, the audio normalization gain value may be selected automatically based on a number of predetermined, target loudness values that are associated with a number of different types of audio content, respectively, in response to the type of audio content in the input audio signal. For example, if the audio program is classical music, then a different target loudness value is selected than if the target program were pop music, or a dialog or talk show, or an action packed motion picture.

FIG. 1 shows the input signal to the audio measurement module 6 passing through the following three signal processing blocks: a multiplier (for dynamic range adjustment), a downmix processor 20 (to result in a downmix of a multi-channel audio signal), and a pre-conditioning filter 9. However, this is just one embodiment that is being illustrated in FIG. 1. In other embodiments, one or more of those three signal processing blocks can be omitted. For example, if downmix is not indicated for the audio signal (audio program), then the downmix processor 20 can be omitted from the encoding stage, so that the audio signal would be subjected to only dynamic range adjustment and pre-conditioning (before being processed by the audio measurement module 6). As another example, the pre-conditioning filter 9 may be omitted, while downmix and dynamic range adjustment are still indicated, in which case the audio signal would be subjected to only dynamic range adjustment and a downmix (before being processing by the audio measurement module 6).

Still referring to FIG. 1, in addition to the DRC gains as metadata, the encoding apparatus may also provide the index of the selected DRC characteristic in a new metadata transport field, as further metadata (associated with the encoded audio signal). In the example of FIG. 1, an auxiliary data channel 7 is used to provide the index, while the DRC gains are embedded with the encoded audio signal. The auxiliary channel is separate from the primary data channel in which the encoded audio is being delivered. There are several means that are possible for providing the metadata that is associated with the encoded audio signal. FIG. 1 only shows one mechanism, where the DRC gain values have been embedded (by a multiplexor) with the encoded audio in the same bitstream (the "primary" data channel), while the loudness parameters are supplied through an auxiliary data channel processor 7. In another means, an assembler or formatter arranges the DRC gain values with the encoded audio signal into frames or packets within a single file, for example. In yet another means, a compressor can be added that reduces the bitrate of the DRC gain values as they are embedded with the audio signal in the same file or bitstream. In yet another means, the auxiliary data channel processor 7 arranges the DRC gain values into the auxiliary data channel (in addition to other metadata).

In addition to the index of the current DRC characteristic, the metadata may also include a program loudness value computed by an audio measurement module 6 in the encoding stage, and also optionally a true peak value. The audio measurements performed based upon the input audio signal to compute the program loudness and true peak values may be in accordance with any suitable, known technique, e.g. in accordance with ITU-BS.1770-3. In a further embodiment, as illustrated in FIG. 1, this audio measurement can use the DRC gain values that were computed by the DRC processor 4, in order to compute the loudness parameters (e.g., program loudness and true peak values) that are then provided as other metadata. In other words, a program loudness value and a true peak value may be computed for the audio program based on the DRC adjusted or compressed version of the input audio signal (without $G_{LN}$ normalization). Note here that as illustrated in FIG. 1, the compressed audio signal may be a multi-channel audio signal that is processed by a downmix processor 20, which results in a particular downmix audio signal being produced and fed to an input of the audio measurement module 6. The downmix processing here is optional in that the downmix processor 20 may be omitted or skipped, so that the audio measurements are performed upon the compressed audio signal without downmixing.

In a further embodiment, for performing the audio measurement (in audio measurement module 6), an optional preconditioning filter 9 is used that has been configured based upon 1) a feature or characteristic of the input audio signal and/or 2) a characteristic of an end user playback device that is expected to receive and perform a playback of the encoded audio bitstream. As seen in FIG. 1, the input audio signal may be preconditioned by the filter 9, prior to being input to the module 6 where a loudness computation will be performed upon it. The preconditioning filter 9 may be, for example, a high pass filter, a bandpass filter or a combination thereof, that models the frequency response or transfer function of the digital to analog and speaker (transducer) stages of a particular playback device, e.g. a consumer electronics device such as a desktop computer, a laptop computer, a tablet computer, smartphone, or a digital media player that is designed to receive digital content over the Internet and perform playback through an attached display monitor.

Figure 3:
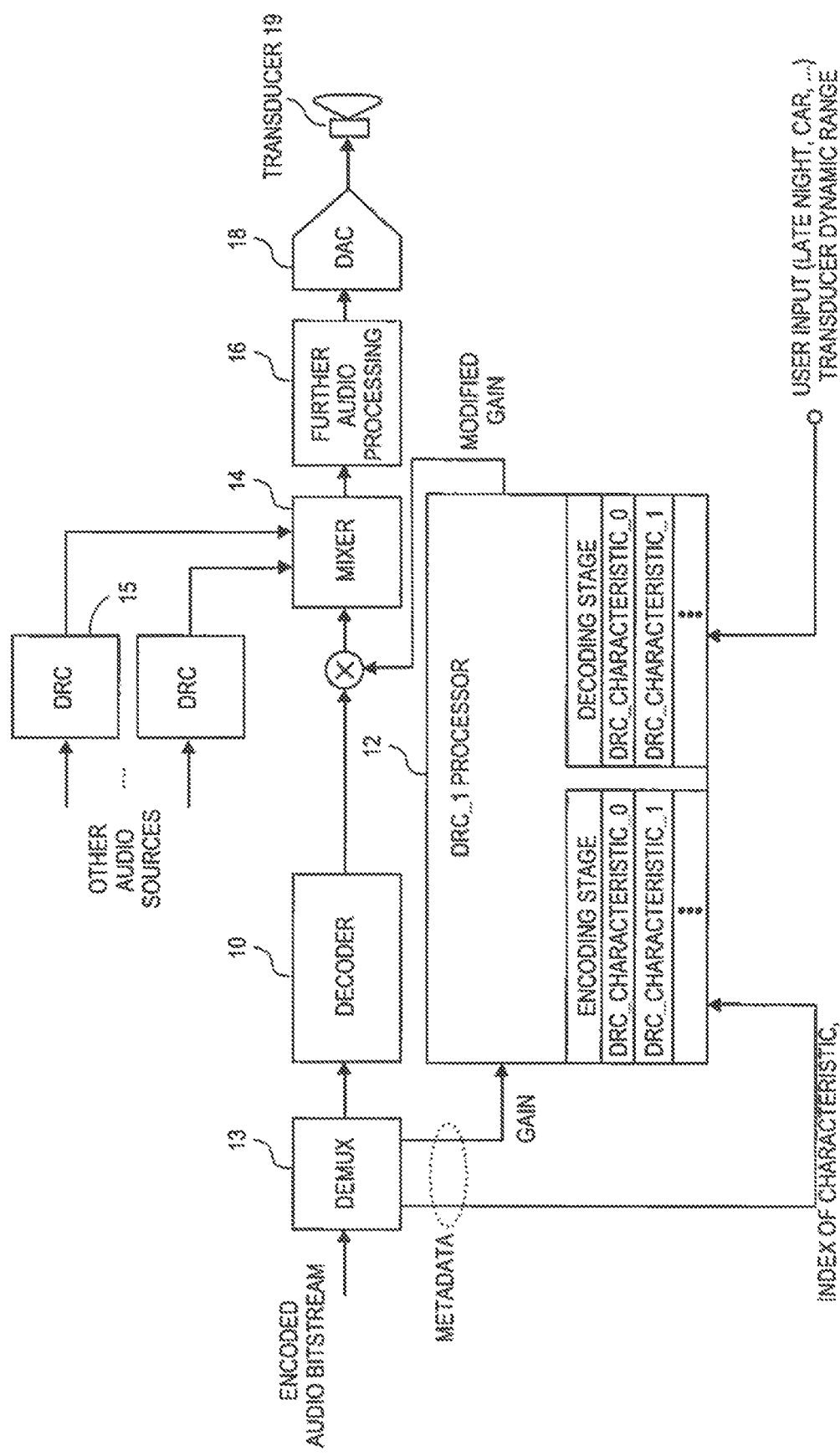
FIG. 3 is a block diagram of relevant components of a decoder stage or decoder apparatus, and in particular one in which the processing is performed during playback of the decoded audio signal.

Turning now to FIG. 3, this is a block diagram of relevant components of a decoding stage or decoding apparatus. The block diagram in FIG. 3 provides support for not only a digital audio decoder apparatus or decoding stage, but also a method for decoding audio, as explained below. The decoder apparatus shown has a decoder 10 that receives an encoded audio signal that has been extracted from an encoded audio bitstream by a demultiplexer 13. The bitstream may include embedded metadata, for example DRC gain values, an index of DRC characteristic (used in the encoding stage), and loudness parameters. As suggested above with respect to the encoding apparatus, an alternative is to include some or all of the metadata in a separate auxiliary data channel 7 (see FIG. 1). In both instances, an encoded audio signal is provided as input to the decoder 10 which, in response, produces a decoded audio signal. The decoder 10 may be complimentary to the encoder 2 of FIG. 1, so as to be able to recover a signal that may be essentially similar to the original input audio signal of the encoding stage. The decoded audio signal passes through optional signal processing blocks 14, 16 until it arrives at a digital to analog converter (DAC) 18 and power amplifier (not shown), where it is converted into analog form and applied to drive a transducer (speaker) 19.

The decoding apparatus also has a DRC_1 processor 12 that receives metadata associated with the encoded audio signal, wherein the metadata includes the DRC gain values that were computed in the encoding stage. The DRC_1 processor 12 can modify those gain values to produce new or modified gain values. This modification may be based on local parameters, including user input and/or dynamic range of a transducer 19 (e.g., a built-in speaker or an external, wireless or wired attached speaker), power amplifier (not shown) and digital-to-analog converter (DAC) 19 combination, that are being used for playback of the decoded audio signal. The modified gain values are then applied to the decoded signal (this adjustment is depicted by the multiplier symbol), before being fed to optional mixing and further audio processing block (blocks 14, 16), and then on to the DAC 18. The modified DRC gain values are thus applied to the decoded audio signal to produce a so-called decoding stage DRC adjusted audio signal. The latter may be combined by a mixer 14 with other decoding stage DRC adjusted audio signals from other audio sources as shown (i.e., through other dynamic range adjustment units 15) before being fed to the DAC 18.

In one embodiment, the received metadata in the decoding stage includes an index of a previously selected or current DRC characteristic (in accordance with which the DRC gain values were computed in an encoding stage, as in FIG. 1). In one example, a copy of the selected or current DRC characteristic may be stored in the DRC_1 processor 12 and is associated with such index. This is referred to as an encoding stage DRC characteristic. In contrast, DRC_1 processor 12 may also contain a number of so-called decoding stage DRC characteristics as shown. One of the latter is used to produce the new or modified gain values, as follow.

In one embodiment, the DRC_1 processor 12 "inverts" the operations performed by the DRC processor 4 of the encoding stage, so as to obtain a short-term loudness or DRC input level (e.g., in dB) starting from the selected or current DRC characteristic that is stored in the processor 12, by applying a received DRC gain value (from the received metadata) to the current DRC characteristic. This recovered short-term loudness value is then used as input into a selected one of the decoding stage DRC characteristics, in order to yield a new or modified gain value. The latter is referred to here as a decoding stage or decoder DRC gain value. Each of the decoding stage and encoding stage DRC characteristics may be stored in a lookup table manner.

The selection of a decoding stage DRC characteristic may be in accordance with one or more of the following: user context (including late night, walking, running, in-vehicle or in-car, and headset vs. built-in loudspeaker), and speaker signal path dynamic range. The decoding apparatus of FIG. 3 in that case may be embedded within an end user device such as a mobile phone, a laptop computer, or a tablet computer that often finds itself in quite different user contexts. Such contexts may be detected by known electronic sensor hardware and software, including ambient light and position, orientation or motion sensors. The transducer signal path dynamic range may be determined in advance by a manufacturer of the end user device and may be stored or otherwise provided to the DRC_1 processor 12 for use during the decoding process. The transducer dynamic range may include a dynamic range of the DAC 18. In the event that a larger dynamic range is available, the DRC_1 processor 12 can select a decoding stage DRC characteristic that allows more dynamic range to be retained, over the expected range of short-term loudness of the decoded audio signal.

In another embodiment, also depicted in FIG. 3, the received metadata in a decoding stage may further include a number of loudness parameters that may be one or more of the following: program loudness, true peak, a loudness range, maximum momentary loudness, and short-term loudness. One or more of such values may be used by the DRC_1 processor 12 when producing the modified or new DRC gain value (on a per frame basis).

As described above, the DRC_1 processor 12 in the decoding stage (also referred to as the decoder DRC processor) may generate its modified DRC gain values using a selected decoding stage DRC characteristic. It was suggested above that the latter may be one of several predefined DRC characteristics that are stored in the processor 12 and that may be accessed in accordance with a user input or user context control signal. FIG. 4 illustrates several examples of decoding stage DRC characteristics that can be used. These include one for late night use, another for in-car or in vehicle use, and another for a speaker or transducer 19 that has limited dynamic range.

In accordance with another embodiment of the invention, a combination of components from FIG. 1 and FIG. 3 can yield a system for both encoding and decoding an audio signal. A number of encoder dynamic range control (DRC) characteristics are stored in the encoder stage. Each of these relates DRC gain values to short-term loudness values, where each loudness value may refer to the average power of an audio signal over a predetermined interval, e.g. on the order of about one frame of digital audio, e.g. between 5 and 100 milliseconds long. One of the encoder DRC characteristics is selected and is then used to produce encoder stage gain values. These are then provided as metadata associated with an encoded audio signal. Several examples of such an encoder stage were given above and described in connection with FIG. 1.

The decoder stage has a processor that stores not just the encoder DRC characteristics but also a number of decoder DRC characteristics. Each of the latter relates DRC gain values to short-term loudness values, which may be similar to those computed in the encoder stage for use in determining the encoder DRC gain values. The processor in the decoder stage is to compute decoder stage gain values using the encoder stage gain values from the encoder stage. In a particular case, the processor in the decoder stage uses an index of a selected encoder DRC characteristic together with the metadata-based encoder stage gain values, in order to compute its decoder stage gain values. Examples of this were given above and described in connection with FIG. 3. The decoder stage ultimately can (when used as part of playback processing in, for example, an end user device) decode the encoded audio signal and then apply the decoder stage gain values to achieve a desired dynamic range adjustment (upon the decoded audio signal).

In accordance with yet another embodiment of the invention, a method for providing encoded audio and associated metadata involves downmix of a multi-channel audio signal. As seen in FIG. 1, a set of loudness parameters are computed by an audio measurement module 6 based upon the multi-channel digital audio signal having passed through a downmix processor 20, where the parameters describe loudness profile of a downmix of the multi-channel audio signal. For example, a six or seven channel audio signal may be processed by the downmix processor 20 into a two-channel or stereo signal; more generally, a downmix is a conversion of an audio signal of N channels into one that has M channels, where N is greater than M.

The multi-channel audio signal is encoded, and the encoded signal is provided together with metadata associated therewith, where the metadata in this case includes the computed set of loudness parameters that describe loudness profile of the downmix. The metadata may also include a base channel layout of the multi-channel audio signal. For example, the base channel layout may give details of a 5.1 surround multi-channel audio signal by identifying each of the six channels, e.g. front center, front right, front left, surround left, surround right, and subwoofer. The encoded multichannel audio signal and its associated metadata may then be received by a decoding stage—see FIG. 5 for example described below—in which the encoded audio signal is decoded and processed so as to produce a downmix, in accordance with the set of loudness parameters and the base channel layout included in the metadata. The metadata could also include the downmix gains that were used in the encoding stage to compute the particular downmix for which loudness parameters were included in the metadata. Note that in such an embodiment, there need not be any adjustments performed for dynamic range by the decoding stage (during playback through a local speaker). Such a scheme may be implemented by, for example, adopting the convention where if the metadata received in the decoding stage contains no DRC gain values, then no DRC adjustment is performed upon the decoded signal.

Figure 5:
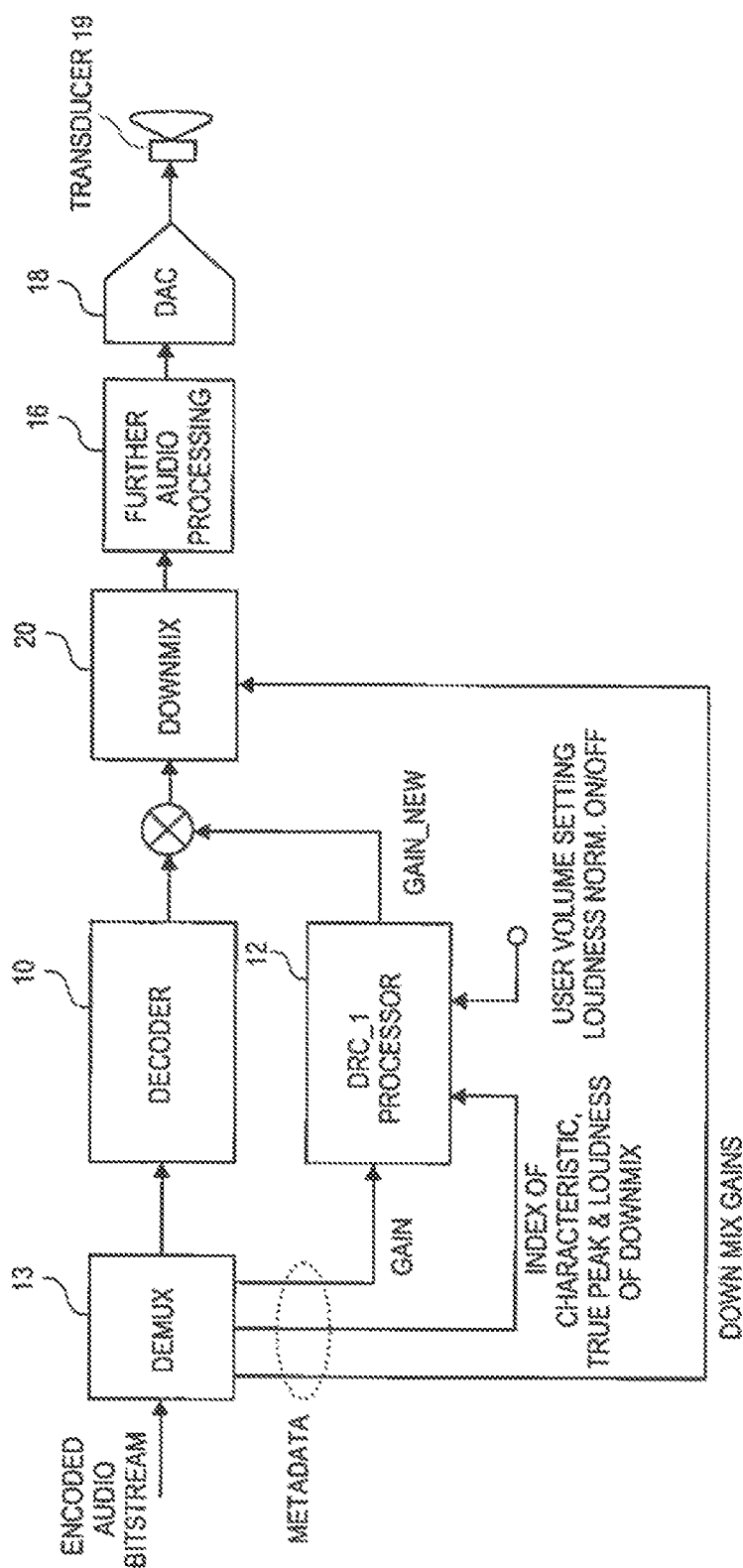
FIG. 5 is a block diagram of components in the decoding stage that has a downmix processor receiving a decoded, multi-channel audio signal.

FIG. 5 depicts another embodiment of the invention where the metadata associated with an encoded multi-channel audio signal could further include DRC gain values, in addition to loudness parameters such as true peak and program loudness concerning a downmix. This figure depicts a decoding stage in some ways similar to the one in FIG. 3 in that it may contain a demultiplexer 13 followed by a decoder 13, optional further audio processing 16, and the DAC 18. Here as well, the received metadata associated with the encoding audio signal provides DRC gain values. These are to be used in the decoding stage to perform dynamic range adjustments upon the decoded audio signal, prior to processing the decoded audio signal to produce the downmix. In other words, an encoded, multi-channel audio signal is decoded by the decoder 10, and then one or more of the decoded channels are adjusted by either new DRC gain values or by original DRC gain values (the latter having been obtained from the demultiplexer 13). This occurs prior to a downmix module 20 producing a particular downmix. The downmix module 20 may use downmix gain values that are also extracted from the metadata (as was suggested above). In another embodiment, the decoded audio signal is adjusted for dynamic range using new gain values that are computed by the DRC_1 processor 12 using, for example, procedures similar to those described above in connection with FIG. 3. The local parameters that may impact the new gain values here may be similar and include the user volume setting and a loudness normalization on/off switch. These local parameters may govern the selection of a particular one of several available decoding stage DRC characteristics, for producing new DRC gain values.

As an alternative to the approach described in the previous paragraph, the DRC gain values produced by the DRC_1 processor 12 (in the decoding stage) may be designed to be applied downstream of the downmix module 20. To illustrate such an embodiment, the decoding stage in FIG. 5 can be modified so that the input of the multiplier shown therein (whose other input receives the DRC gain values from the DRC_1 processor 12) would be positioned downstream of the downmix module 20 (and upstream of the DAC 18). The DRC_1 processor 12 in this case may either produce modified DRC gain values that are based on original DRC gain values received through metadata (from an encoding stage), or it may pass through the original DRC gain values, to the adjuster or multiplier block. A corresponding encoding stage, to produce the particular form of original DRC gain values for this case, may be as shown in FIG. 7.

Figure 7:
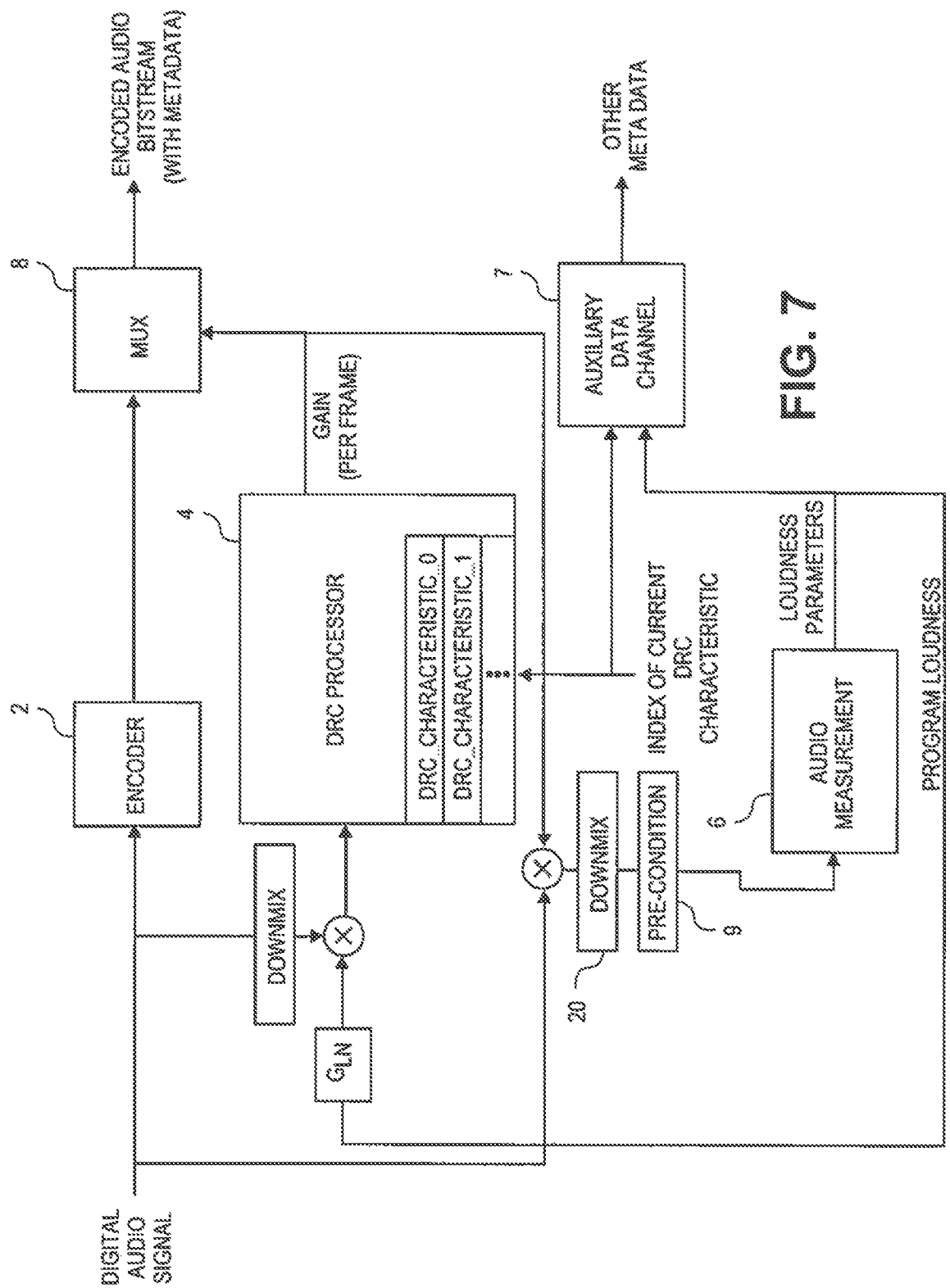
FIG. 7 is a block diagram of relevant components of a digital audio encoding stage or encoding apparatus suitable for a particular downmix scenario.

Referring to FIG. 7, an encoder apparatus is shown that may be similar to that of FIG. 1 except at least in the following aspect. Here, the DRC gains are computed (by the DRC processor 4) in such a way that they can then be directly applied, in the decoder apparatus, to a downmix. In contrast to FIG. 1, the DRC processor 4 of FIG. 7 also operates upon a downmix signal, which is produced by a downmix processor 20 receiving the original multi-channel input audio signal and in response feeding the normalizer (or multiplier) whose other input receives the normalization gain value $G_{LN}$. The encoder 2 could still process the original input audio signal in the same way as in FIG. 1, to generate the encoded signal.

Returning to FIG. 5, the decoding stage therein may receive its encoded audio signal and metadata from an encoding stage (not shown) in which a particular downmix of an input multi-channel audio signal was produced. The current DRC gain values were computed in the encoding stage, using the input multi-channel audio signal and/or the particular downmix of it, and were then provided as metadata along with the encoded version of the multi-channel audio signal (e.g., by assembling the encoded audio signal with the current DRC gain values as metadata within a single encoded bitstream or file, using for example a multiplexer 8 as in FIG. 1). Other means for providing the encoded audio signal together with a computed set of loudness parameters and a base channel layout, and optionally the current DRC parameters (all of which are metadata associated with encoded audio signal) are possible. Examples include an assembler or formatter that arranges the DRC gain values along with the audio signal into frames or packets within a single file, a multiplexer that produces a bitstream containing the DRC gain values that have been time-multiplexed with frames of the encoded audio signal, a compressor that reduces data rate of the DRC gain values as embedded with the encoded audio signal in the same file or in the same bitstream, and an auxiliary data channel processor that arranges the DRC gain values into an auxiliary data channel that is separate from a primary data channel (where the latter contains the encoded audio signal that is being delivered to the decoding stage of FIG. 5).

Note that as suggested earlier, if the metadata associated with the encoded multi-channel audio signal either does not specify making dynamic range adjustments, or simply does not contain DRC gain values or DRC parameters (for instance making no mention of a valid index of DRC characteristic), then the decoded audio signal is processed to produce the downmix but without performing any dynamic range adjustments upon the decoded audio signal. This could be as if in FIG. 5, the DRC_1 processor 12 would provide all of its new gain values to be 0 dB, meaning no adjustment is to be performed upon the dynamic range of the decoded audio signal.

In the event that the DRC_1 processor 12 does receive DRC parameters as metadata, new gain values can be produced by the processor 12 in accordance with a decoding stage DRC characteristic that may be selected from the examples depicted in FIG. 6 (or other suitable DRC characteristics). FIG. 6 shows three different DRC characteristics where each is associated with a different user volume setting or level. As can be seen, as the volume increases, the amount of compression defined by the DRC characteristic increases when short-term loudness is increasing.

Examples of codecs that can benefit from the techniques described here include standards by MPEG and ATSC such as AAC and AC-3, although other standards or approaches that contain mechanisms to control loudness and dynamic range of a decoded audio signal can also benefit.

Example Audio Measurements that May be Stored as Metadata

The audio measurement module 6 may be a software routine that is to be executed by a processor, or an arrangement of hardwired digital audio processing logic circuitry, that computes or provides one or more loudness parameters for a given digital audio file. The routine may be used in a range of audio products such as media players, for loudness normalization of music content. The computed audio measurements may be stored as metadata in an encoded audio file, during a digital audio coding process. For example, MPEG currently provides bitstream fields in which such metadata can be stored. Current uses of such fields include the storage of reference loudness, Dynamic Range Control (DRC) gains per frame of digital audio, and downmix weighting factors. In accordance with an embodiment of the invention, a new "box" is defined in the "sample description extension" of the MPEG-4 audio systems framework, to store the metadata (as described further below).

Program Loudness is an audio measurement that may be an average loudness estimate of the entire content of a digital audio file. An example can be computed in accordance with ITU-BS.1770-3. The Program Loudness may be computed in an encoding stage, after having applied dynamic range compression to an audio content signal, e.g. see FIG. 1 where the un-normalized audio signal is adjusted for dynamic range prior to being preconditioned by the filter 9 and fed to the audio measurement module 6 (while skipping the downmix processor 20). In another embodiment, the Program Loudness may be computed by the audio measurement module 6 in an encoding stage, for a downmix of the audio content signal, e.g. see FIG. 1.

The True Peak value is an audio measurement that may be the maximum sample magnitude of an audio bitstream from the audio file (e.g., at a 4× oversampled rate). An example can be computed per ITU-BS.1770-3.

Loudness Range may be an audio measurement that is based on ITU BS.1770 or as per a European Broadcasting Union (EBU) specification. It measures the statistical distribution of the loudness for a given block size of digital audio (e.g., 400 ms blocks) and generates the difference of a low and high percentile of the loudness distribution to describe the dynamic range. Other audio measurements that indicate loudness range are possible.

Metadata Enhancements

An embodiment of the invention here is a new "box" in the "sample description extension" part of the MPEG-4 Systems framework that may be filled with static metadata for each track (audio program), e.g. program loudness, anchor loudness, true peak, and loudness range. Additional per-track or per-audio program content of the new box within MPEG-4 Sample Description Extension may include: max. momentary loudness such as over a 0.4 sec window, max short term loudness such as over a 0.3 sec window, channel mapping which defines channel layout for playback systems including height channels and others, DRC channel mapping, index of DRC characteristic, downmix coefficients, program loudness of stereo downmix, anchor loudness of stereo downmix, and true peak of stereo downmix. While other auxiliary data channels for passing the metadata to the playback processor are possible as described above, the particular approach here may have the following advantages; static metadata is available without decoding the audio bit stream; addition of Anchor Loudness (aka dialnorm) to support movie/TV content volume normalization; knowledge of the DRC characteristic used in the encoder can help predict the effect of the DRC gains; knowledge of the DRC characteristic can be used to modify the DRC characteristic at the decoder; downmix coefficients can be defined in a future-proof manner that can support multichannel audio formats greater than 5.1; and better control over downmix loudness and clipping.

Metadata Use

Use of Program Loudness or Anchor Loudness is suitable for loudness normalization. Anchor Loudness is usually based on extracted speech segments and may apply to movie/TV-show content only.

Regarding dynamic range control (DRC), several metadata values can be made available that describe aspects of the dynamic range of the recorded audio content (see table below). The size of the dynamic range can be useful in adjusting DRC during playback, e.g. the DRC is less aggressive if the dynamic range is small or the DRC can even be turned off. In addition, a target dynamic range can be set depending on user input, volume setting and DAC dynamic range and speaker dynamic range, and select a DRC characteristic so that the range will be reduced to the target. This may also take into account a reasonable dynamic range limitation for smaller spaces (listening environments). True Peak and maximum loudness values can be useful for estimating the headroom, for instance when loudness normalization results in a positive gain [dB] or when headroom is needed to avoid clipping of the downmix. The DRC characteristic can then be adjusted to approach a headroom target.

Example Metadata that Describes Aspects of the Dynamic Range

| | |
|---|---|
| Loudness Range | Size of range derived from loudness histogram |
| Program Loudness | This value can be combined with one of the peak values below to estimate the dynamic range |
| True Peak | Could use the difference (True Peak) − (Program Loudness) as dynamic range estimate. The True Peak can change significantly after the original audio content or audio program has passed through the codec |
| Max. momentary loudness (e.g., 0.4 s) | A description of the loudness peak, that won't change much after the codec. The window size may be compatible with ITU BS.1770. Subtract Program Loudness to get an estimate of the dynamic range. |
| Max. short term loudness (e.g., 3 s) | A description of the loudness peak, that won't change much after the codec. The window size is longer than the one in ITU BS.1770. Subtract Program Loudness to get an estimate of the dynamic range. |

A DRC processor is used in the encoder stage to generate gain values using a selected one of the pre-defined DRC characteristics. The index of the selected DRC characteristic may be transmitted in the new MPEG-4 box. The gain values (per frame) may be transmitted in existing fields (during light and/or heavy compression).

As seen for example in FIG. 1, program loudness normalization gain $G_{LN}$ is applied at the input to the DRC processor 4 to ensure proper level alignment with respect to the selected DRC characteristic. The normalization gain may be computed based on the Program Loudness value $L_{PL}$ that is produced by the audio measurement module 6, and the DRC Target Loudness value $L_{CTL}$ [dB] as $G_{LN}=L_{CTL}-L_{PL}$ [dB] with, as an example, $L_{CTL}=-31$ dB.

In accordance with an embodiment of the invention, the extracted DRC gain values are changed in the decoding stage, to in effect achieve custom DRC that may be adapted to various conditions, by for example changing to a different DRC characteristic (than what was used in the encoding stage). The processing at playback is now given knowledge of what DRC characteristic was applied in the encoding stage, by virtue of being able to understand the meaning of the extracted index. Local conditions which may justify such changes include: late night mode; noisy environment (e.g., noise inside a moving a car); playback system limitations (e.g., an internal speaker of a laptop, tablet computer or smartphone as opposed to an external loudspeaker or headphones); user preference; and dynamic range of the content. See FIG. 4 for example DRC characteristics useful in such situations.

In one embodiment, the available DRC characteristics should be based on steady state input/output levels of the compressor, for a sine input at 1 kHz. This maintains compatibility with compressors that use k-weighted loudness estimation. It is assumed here that the DRC characteristic is applied to the loudness normalized audio signal. This is important for having the DRC dead-band at the correct level (if applicable) and produces more consistent results for content with various loudness levels, especially if such content are played back with loudness normalization turned on.

Downmix

Downmixing refers to the manipulating of audio where a number of distinct audio channels are mixed to produce a lower number of channels. Downmix can be controlled here by the audio program production facility if necessary. For instance, some content may require more attenuation of the surround channels before downmixing, to maintain intelligibility.

Currently DVB and MPEG require the use of DRC when generating a downmix, if DRC_presentation_mode is set. This may result in a loss of dynamic range in the downmix. In contrast, to maintain the dynamic range when appropriate, an embodiment of the invention here is an adaptive scheme where DRC compression is only required for downmixing during high playback volume as shown in FIG. 5. The application of DRC is then adapted to only reduce the level of the loudest segments (see for example FIG. 6). Furthermore, the True Peak value of the stereo downmix, which may have been computed at the encoding stage by the audio measurement module 6—see FIG. 1—and that was provided as metadata, can now be extracted at the decoding stage and used to estimate how much DRC compression is needed to be applied to the decoded signal prior to the downmix. Note that although FIG. 5 shows an embodiment where the DRC gain values from the processor 12 are applied to the decoded signal prior to handing the decoded signal off to the downmix processor 20, an alternative here is to apply the DRC gain values after downmix, e.g. directly to the output of the downmix processor 20.

If downmixing is used and DRC compression is independently active, the DRC characteristic can be modified if necessary so that enough headroom is achieved for the downmix. This solution provides more flexibility. Also, the stereo downmix can be normalized for loudness in the decoding stage, using for example Loudness K-weighted relative to Full Scale (LKFS) values (which were received as metadata). These LKFS values are loudness parameters that were computed in the encoding stage by the audio measurement module 6 based upon a downmixed version of the original multi-channel digital audio signal (see FIG. 1). This ensures that multi-channel content and stereo content will play back at the same level, over a stereo system.

STATEMENTS OF INVENTION

1) A system for encoding and decoding an audio signal, comprising: an encoder stage in which are stored a plurality of encoder dynamic range control (DRC) characteristics, wherein each of the encoder DRC characteristics relates gain values to loudness values, the encoder stage to produce encoder stage gain values using a selected one of the encoder DRC characteristics and provide the encoder stage gain values as metadata associated with an encoded audio signal; and a decoder stage having a processor that stores a) said plurality of encoder DRC characteristics and b) a plurality of decoder DRC characteristics, wherein each of the decoder DRC characteristics relates gain values to loudness values, and is to compute decoder stage gain values using the encoder stage gain values from the encoder stage.

2) The system of statement 1 wherein the encoder stage is to provide an index of the selected encoder DRC characteristic, and the processor in the decoder stage is to use the index and the encoder stage gain values to compute the decoder stage gain values.

3) The system of statement 1 wherein the decoder stage is to decode the encoded audio signal and then apply the decoder stage gain values to achieve dynamic range control upon the decoded audio signal.

4) A method for decoding audio, comprising: receiving encoded audio signal and metadata associated therewith, wherein the metadata can include one of a plurality of sets of loudness parameters, wherein the plurality of sets of loudness parameters include a) a set that describes loudness profile of a respective downmix and b) a set that describes loudness profile of a base channel layout; decoding the encoded audio signal to produce decoded audio signal; and processing the decoded audio signal to produce a downmix in accordance with the set of loudness parameters included in the metadata.

5) The method of statement 4 wherein the metadata associated with the encoded audio signal further comprises DRC parameters, the method further comprising: performing dynamic range adjustments upon the decoded audio signal in accordance with the DRC parameters, prior to or after processing the decoded audio signal to produce the downmix.

6) The method of statement 4 wherein the metadata associated with the encoded audio signal either does not specify making dynamic range adjustments or does not contain DRC parameters, and wherein processing the decoded audio signal to produce the downmix occurs without performing dynamic range adjustments upon the decoded audio signal prior to producing the downmix.

7) A digital audio decoder apparatus, comprising: a decoder to receive encoded audio signal and produce decoded audio signal; and a downmix processor to receive the decoded audio signal and metadata associated therewith, wherein the metadata includes a set loudness parameters being one of a) a set that describes loudness profile of a respective downmix or b) a set that describes loudness profile of a base channel layout, wherein the downmix processor is to produce downmixed audio signal in accordance with the set of loudness parameters included in the metadata.

8) A method for providing encoded audio and associated metadata, comprising: computing a set of loudness parameters based upon a multi-channel audio signal that describes loudness profile of a downmix of the multi-channel audio signal; encoding the multi-channel audio signal; and providing a) the encoded multi-channel audio signal and b) associated therewith as metadata the computed set of loudness parameters and a base channel layout of the multi-channel audio signal.

9) The method of statement 8 further comprising: producing the downmix of the multi-channel audio signal; computing dynamic range control (DRC) gain values using the downmix; and assembling the encoded audio signal with the computed DRC gain values as metadata that is associated with the encoded audio signal.

10) A digital audio encoder apparatus, comprising: a loudness parameter calculator that is to compute a set of loudness parameters that describe loudness profile of a downmix of a multi-channel audio signal; an encoder to encode the multi-channel audio signal; and means for providing the encoded audio signal together with the computed set of loudness parameters and a base channel layout of the multi-channel audio signal as metadata that is associated with the encoded audio signal.

11) A method for decoding audio, comprising: receiving an encoded audio signal and metadata associated therewith, wherein the metadata includes a set of loudness parameters; decoding the encoded audio signal to produce a decoded audio signal; and processing the decoded audio signal to achieve dynamic range compression of the decoded audio signal, in accordance with one of a) the set of loudness parameters included in the metadata, b) playback volume, or c) target headroom.

As explained above, an embodiment of the invention may be a machine-readable medium (such as microelectronic memory) having stored thereon instructions, which program one or more data processing components (generically referred to here as a "processor") to perform the digital audio processing operations described above including encoding, decoding, loudness measurements, filtering, mixing, adding, inversion, comparisons, and decision making. Such instructions may be part of a media player application program. In other embodiments, some of those operations might be performed by specific hardware components that contain hardwired logic (e.g., dedicated digital filter blocks, state machines). Those operations might alternatively be performed by any combination of programmed data processing components and fixed hardwired circuit components.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, although each of the encoding and decoding stages have been described in one embodiment as operating separately for example in an audio content producer machine and in an audio content consumer machine that are communicating over the Internet, the encoding and decoding could also be performed within the same machine for example as part of a transcoding process. The description is thus to be regarded as illustrative instead of limiting.

What is claimed is:

1. A method for decoding audio, comprising:
   receiving an encoded, multi-channel audio signal and metadata associated with the multi-channel audio signal, wherein the metadata includes a) one or more loudness parameters that describes loudness profile of a downmix of the multi-channel audio signal, or b) one or more loudness parameters that describes loudness profile of a base channel layout of the multi-channel audio signal;
   decoding the encoded, multi-channel audio signal into a decoded, multi-channel audio signal; and
   processing the decoded, multi-channel audio signal to produce a downmix in accordance with the one or more loudness parameters included in the metadata.

2. The method of claim 1 wherein the one or more loudness parameters is selected from the group consisting of: program loudness being an audio measurement that is an average loudness estimate of an entire content of a digital audio file, true peak, loudness range, maximum momentary loudness, and short-term loudness values.

3. The method of claim 1 wherein the metadata further includes a plurality of dynamic range control, DRC, parameters, the method further comprising
   performing dynamic range adjustments upon the decoded, multi-channel audio signal or upon the downmix, in accordance with the DRC parameters.

4. The method of claim 3 wherein the one or more loudness parameters is selected from the group consisting of: program loudness, true peak, loudness range, maximum momentary loudness, and short-term loudness values.

5. The method of claim 4 wherein the one or more loudness parameters is true peak of a stereo downmix of the encoded multi-channel audio signal, the method further comprising
   using the true peak to estimate how much dynamic range compression is to be applied prior to producing the downmix.

6. The method of claim 3 wherein the dynamic range adjustments, when producing the downmix, are performed only when playback volume is above a threshold.

7. The method of claim 1 wherein the metadata does not specify making dynamic range adjustments or does not contain dynamic range control, DRC, parameters, and wherein processing the decoded, multi-channel audio signal to produce the downmix occurs without performing dynamic range adjustments upon the decoded, multi-channel audio signal prior to producing the downmix.

8. The method of claim 7 wherein the one or more loudness parameters is selected from the group consisting of: program loudness, true peak, loudness range, maximum momentary loudness, and short-term loudness values.

9. An audio decoder apparatus, comprising:
   a decoder to receive an encoded, multi-channel audio signal and metadata associated with the multi-channel audio signal, wherein the metadata includes a) one or more loudness parameters that describes loudness profile of a downmix of the multi-channel audio signal, or b) one or more loudness parameters that describes loudness profile of a base channel layout of the multi-channel audio signal, and decode the encoded, multi-channel audio signal into a decoded, multi-channel audio signal; and
   a downmix processor to process the decoded, multi-channel audio signal into a downmix in accordance with the one or more of the loudness parameters included in the metadata.

10. The audio decoder apparatus of claim 9 wherein the one or more loudness parameters is selected from the group consisting of: program loudness being an audio measurement that is an average loudness estimate of an entire content of a digital audio file, true peak, loudness range, maximum momentary loudness, and short-term loudness values.

11. The audio decoder apparatus of claim 9 wherein the metadata further includes a plurality of dynamic range control, DRC, parameters, the audio decoder apparatus further comprising a dynamic range control, DRC, processor that is to perform dynamic range adjustments upon the decoded, multi-channel audio signal or upon the downmix, in accordance with the DRC parameters.

12. The audio decoder apparatus of claim 11 wherein the one or more loudness parameters is selected from the group consisting of: program loudness, true peak, loudness range, maximum momentary loudness, and short-term loudness values.

13. The audio decoder apparatus of claim 12 wherein the one or more loudness parameters is true peak of a stereo downmix of the encoded multi-channel audio signal, and the DRC processor is to use the true peak to estimate how much dynamic range compression is to be applied prior to the downmix being produced.

14. The audio decoder apparatus of claim 11 wherein the dynamic range adjustments, when producing the downmix, are performed only when playback volume is above a threshold.

15. The audio decoder apparatus of claim 9 wherein the metadata does not specify making dynamic range adjustments or does not contain dynamic range control, DRC, parameters, and wherein processing the decoded, multi-channel audio signal to produce the downmix occurs without performing dynamic range adjustments upon the decoded, multi-channel audio signal prior to producing the downmix.

16. The audio decoder apparatus of claim 15 wherein the one or more loudness parameters is selected from the group consisting of: program loudness, true peak, loudness range, maximum momentary loudness, and short-term loudness values.

17. The apparatus of claim 9 wherein the decoder and the downmix processor are part of an end user device that further comprises a digital to analog converter to convert the downmix into analog form during playback of the encoded, multi-channel audio signal.

18. A method for decoding audio, comprising:
receiving an encoded audio signal and metadata associated with the encoded audio signal, wherein the metadata includes one or more loudness parameters;
decoding the encoded audio signal to produce a decoded audio signal; and
processing the decoded audio signal in accordance with a) the one or more loudness parameters included in the metadata, b) playback volume, or c) target headroom, to achieve dynamic range compression of the decoded audio signal, wherein processing the decoded audio signal to achieve dynamic range compression comprises
   selecting a target DRC characteristic from amongst a plurality of stored DRC characteristics based on one or more of the following: playback volume setting; user context including late night, walking, running, or car; DAC dynamic range; or speaker dynamic range,
   applying a plurality of input levels, representing the decoded audio signal, as a plurality of inputs to the target DRC characteristic resulting in a plurality of DRC gain values, respectively; and
   applying the plurality of DRC gain values to the decoded audio signal.

19. The method of claim 18 wherein the metadata further includes a plurality of encoder-side dynamic range control, DRC, gain values and an index of an encoder-side characteristic that was used to produce the plurality of encoder-side DRC gain values, the method further comprising
   producing the plurality of input levels by applying the plurality of encoder-side DRC gain values to an inverse of the encoder-side characteristic.

* * * * *